US010110171B2

(12) United States Patent
 Takahashi et al.

(10) Patent No.: US 10,110,171 B2
(45) Date of Patent: Oct. 23, 2018

(54) AMPLIFIER

(71) Applicant: SONY CORPORATION, Tokyo (JP)

(72) Inventors: Katsuaki Takahashi, Kanagawa (JP);
 Hideyuki Takano, Kanagawa (JP);
 Naoto Yoshikawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/527,361

(22) PCT Filed: Nov. 19, 2015

(86) PCT No.: PCT/JP2015/082629
 § 371 (c)(1),
 (2) Date: May 17, 2017

(87) PCT Pub. No.: WO2016/084719
 PCT Pub. Date: Jun. 2, 2016

(65) Prior Publication Data
 US 2017/0338774 A1 Nov. 23, 2017

(30) Foreign Application Priority Data

Nov. 28, 2014 (JP) ................ 2014-240808

(51) Int. Cl.
 *H03F 1/26* (2006.01)
 *H03F 3/193* (2006.01)
 (Continued)

(52) U.S. Cl.
 CPC .............. *H03F 1/26* (2013.01); *H03F 1/223* (2013.01); *H03F 3/193* (2013.01); *H03F 3/211* (2013.01); *H03F 3/3022* (2013.01);
 *H03F 3/68* (2013.01); *H03G 1/0088* (2013.01); *H03G 1/0094* (2013.01); *H03F 2200/294* (2013.01);
 (Continued)

(58) Field of Classification Search
 USPC ........... 330/124 R, 295, 84, 286, 53–54, 302
 See application file for complete search history.

(56) References Cited

U.S. PATENT DOCUMENTS 6,335,660 B1 * 1/2002 Frecassetti ............ H03F 1/3241
 330/124 R
7,701,292 B2 4/2010 Lin

FOREIGN PATENT DOCUMENTS

JP 51-140462 A 12/1976
JP 63-160403 A 7/1988
 (Continued)

*Primary Examiner* — Hieu Nguyen
(74) *Attorney, Agent, or Firm* — Chip Law Group (57) ABSTRACT

An output signal can be free of any noise component generated from an amplifier disposed in a path, without degradation of the S/N ratio of the output signal. An amplifier includes: a first amplifier that is connected to an input node and generates a first intermediate signal; a feedback resistor that enables feedback of the first intermediate signal to the input node; an attenuator that receives the first intermediate signal and generates a second intermediate signal; a second amplifier that is connected to the input node and generates a third intermediate signal; a third amplifier that is connected to the input node and generates a fourth intermediate signal; and an adder that generates an output signal, using the second intermediate signal, the third intermediate signal, and the fourth intermediate signal.

13 Claims, 2 Drawing Sheets

(51) Int. Cl.
*H03F 1/22* (2006.01)
*H03F 3/68* (2006.01)
*H03G 1/00* (2006.01)
*H03F 3/21* (2006.01)
*H03F 3/30* (2006.01)

(52) U.S. Cl.
CPC .. *H03F 2200/372* (2013.01); *H03F 2200/451* (2013.01); *H03G 2201/106* (2013.01)

(56) References Cited

FOREIGN PATENT DOCUMENTS

| | | |
|---|---|---|
| JP | 08-172306 A | 7/1996 |
| JP | 2004-187080 A | 7/2004 |
| JP | 2014-093741 A | 5/2014 |

\* cited by examiner

[PRIOR ART]

AMPLIFIER

CROSS REFERENCE TO RELATED APPLICATIONS

This application is a U.S. National Phase of International Patent Application No. PCT/JP2015/082629 filed on Nov. 19, 2015,which claims priority benefit of Japanese Patent Application No. JP 2014-240808 filed in the Japan Patent Office on Nov. 28, 2014.Each of the above-referenced applications is hereby incorporated herein by reference in its entirety.

TECHNICAL FIELD

The present technology relates to amplifiers.

BACKGROUND ART

A communication device such as an RF receiver includes a signal amplifier circuit for amplifying received signals. In such a communication device, it is critical to increase the S/N ratio by reducing noise. However, the signal amplifier circuit is a noise source, and therefore, the noise generated from the signal amplifier when a received signal is amplified is superimposed on the signal. Patent Document 1 discloses a technology for reducing noise generated from the signal amplifier in such a communication device.

Figure 6:
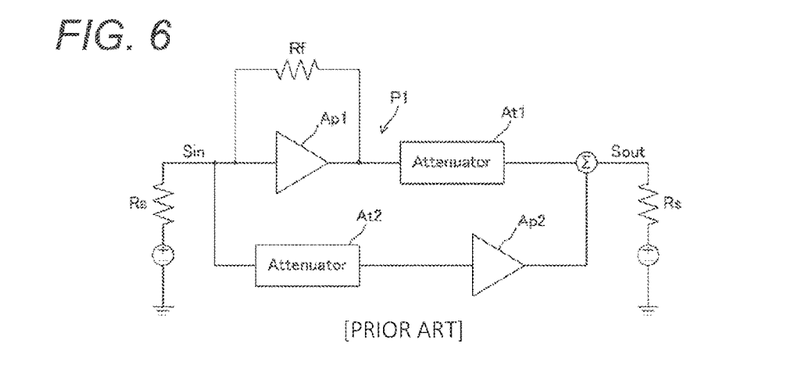
FIG. 6 is a diagram for explaining a conventional noise reduction technology according to Patent Document 1.

FIG. 6 is a diagram for explaining a conventional noise reduction technology according to Patent Document 1.

The circuit shown in the drawing includes: a first amplifier Ap1 that is connected to an input node and generates a first intermediate signal; a feedback resistor Rf that enables feedback of the first intermediate signal to the input node; a first attenuator At1 that receives the first intermediate signal and generates a second intermediate signal; a second attenuator At2 that is connected to the input node and generates a third intermediate signal; a second amplifier Ap2 that receives the third intermediate signal and generates a fourth intermediate signal; and an adder Σ that generates an output signal, using the second intermediate signal and the fourth intermediate signal. The output signal is substantially free of any noise component from the first amplifier Ap1.

CITATION LIST

Patent Document

Patent Document 1: U.S. Pat. No. 7,701,292

SUMMARY OF THE INVENTION

Problems to be Solved by the Invention

In the above described technology according to Patent Document 1, an input signal reaches the adder Σ through a first path in which the first amplifier Ap1 and the first attenuator At1 are disposed in this order, and a second path in which the second attenuator At2 and the second amplifier Ap2 are disposed in this order. As the noise component from the first amplifier Ap1 is substantially eliminated as described above, the noise component generated at the first amplifier Ap1 can be canceled, but the noise component generated at the second amplifier Ap2 cannot be canceled.

Furthermore, since the second attenuator At2 is located in a stage before the second amplifier Ap2 in the second path, the noise component from the second attenuator At2 is added to the noise from the second amplifier Ap2, and accordingly, high noise is output. For example, the attenuation factor of the second attenuator At2 being ½ is synonymous with halving the voltage gain of the second attenuator At2 and doubling the noise from the second amplifier Ap2 in terms of the S/N ratio.

The present technology aims to provide an amplifier that includes a main path in which an amplification unit for amplifying an input signal and outputting the amplified signal is disposed, and a cancellation path for generating a signal to cancel noise output from the amplification unit in the main path, any noise component from the amplifying unit disposed in one of the paths being substantially eliminated from an output signal without degradation of the S/N ratio of the output signal.

Solutions to Problems

One mode of the present technology is an amplifier that includes: a first amplifier that is connected to an input node and generates a first intermediate signal; a feedback resistor that enables feedback of the first intermediate signal to the input node; an attenuator that receives the first intermediate signal and generates a second intermediate signal; a second amplifier that is connected to the input node and generates a third intermediate signal; a third amplifier that is connected to the input node and generates a fourth intermediate signal; and an adder that generates an output signal, using the second intermediate signal, the third intermediate signal, and the fourth intermediate signal.

Another mode of the present technology is an amplifier that includes: a first transistor unit formed with a MOS transistor element, the gate of the MOS transistor element being connected to an input node, the drain of the MOS transistor element being connected to a power supply terminal; a feedback resistor that enables feedback of a source output of the first transistor unit to the input node; a second transistor unit formed with a MOS transistor element, the gate of the MOS transistor element being connected to the input node, the drain of the MOS transistor element being connected to a power supply terminal; a first MOS transistor element of a voltage follower, the source of the first MOS transistor element being connected to an output node, the source output of the first transistor unit and a source output of the second transistor unit being input to the gate of the first MOS transistor element; and a second MOS transistor element, the source and the drain of the second MOS transistor element being interposed between the source of the first MOS transistor element and a power supply terminal, the gate of the second MOS transistor element being connected to the input node.

It should be noted that the amplifiers described above include various modes in which the amplifiers are incorporated into other devices, or are used in conjunction with other methods. The present technology can also be applied to communication systems including the above amplifiers.

Effects of the Invention

The present technology can provide a configuration that can substantially free an output signal from any noise component generated from an amplifier disposed in one of the paths, without degradation of the S/N ratio of the output signal. It should be noted that the advantageous effect described in this specification is merely an example, and the advantageous effects of the present technology are not limited to the example and may include additional effects.

MODES FOR CARRYING OUT THE INVENTION

Figure 1:
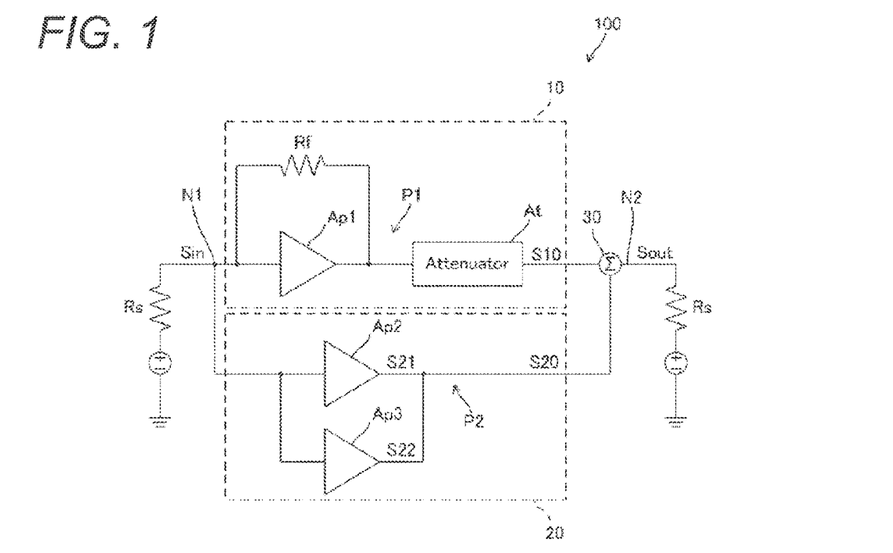
FIG. 1 is a diagram for explaining an amplifier as a circuit according to a first embodiment.

The present technology will be described below in the following order:
(A) First Embodiment
(B) Second Embodiment
(C) Third Embodiment
(A) First Embodiment FIG. 1 is a diagram for explaining an amplifier as an amplifier 100 according to this embodiment. In the amplifier 100 shown in the drawing, a first signal path P1 and a second signal path P2 are formed between an input node N1 and an output node N2.

The end of the first signal path P1 on the side of the output node N2 and the end of the second signal path P2 on the side of the output node N2 are connected to the output node N2 via an adder 30. Accordingly, a signal Sout generated by the adder 30 adding a signal S10 output via the first signal path P1 and a signal S20 output via the second signal path P2 appears at the output node N2.

A first amplification unit 10 that generates a signal S11 by amplifying a signal Sin of the input node N1 is disposed in the first signal path P1. A second amplification unit 20 that generates the signal S20 by amplifying the signal Sin of the input node N1 is disposed in the second signal path P2.

In the first amplification unit 10, a first amplifier Ap1 with an amplification factor −A1 is disposed at a location close to the input node N1 in the first signal path P1, and an attenuator At with an attenuation factor At1 is disposed at a location close to the output node N2 in the first signal path P1. The first amplifier Ap1 outputs the signal S11 by amplifying the signal Sin at the amplification factor −A1, and the attenuator At outputs the signal S10 by attenuating the signal S11 at the attenuation factor At1. It should be noted that the attenuation factor of the attenuator At may be a fixed value, or may be adjusted from outside.

The output side and the input side of the first amplifier Ap1 are connected by a feedback resistor Rf. The feedback resistor Rf feeds the output of the first amplifier Ap1 back to the input side without a phase delay. Because of this, a noise component Sn1 (not shown) generated inside the first amplifier Ap1 is fed back to the input side of the first amplifier Ap1. That is, feedback noise Nf generated by inverting the noise component Sn1 generated inside the first amplifier Ap1 is superimposed on the signal Sin of the input node N1. The feedback noise Nf returned to the input side via the feedback resistor in this manner is lower than the noise component Sn1 appearing in the output of the first amplifier Ap1.

The second amplification unit 20 includes a second amplifier Ap2 and a third amplifier Ap3 as multiple amplifiers that are arranged in parallel between the input node N1 and the output node N2. The amplification factor of the second amplifier Ap2 is −A2, and the amplification factor of the third amplifier Ap3 is −A3. Each of the second amplifier Ap2 and the third amplifier Ap3 is designed to amplify the signal Sin of the input node N1 and output the amplified signal. That is, the signal S20 that is output from the second amplification unit 20 to the adder 30 is a combination of a signal S21 generated by amplifying the signal Sin of the input node N1 at the amplification factor −A2 and a signal S22 generated by amplifying the signal Sin of the input node N1 at the amplification factor −A3.

At this point, the feedback noise Nf that is generated inside the first amplifier Ap1 and is fed back to the input node N1 by the feedback resistor Rf is also amplified together with the signal Sin and is output to the output node N2 by the second amplifier Ap2 and the third amplifier Ap3. As a result, noise that is a combination of the signal generated by amplifying the feedback noise Nf at the amplification factor −A2 and the signal generated by amplifying the feedback noise Nf at the amplification factor −A3 is superimposed on the signal S20 to be output from the second amplification unit 20.

In the amplifier 100 having the above configuration, the second amplification unit 20 as a cancellation amplifier that cancels the noise component Sn1 generated inside the first amplifier Ap1 in the first signal path P1 has an increased number of amplifier tiers, with the two amplifiers of the second amplifier Ap2 and the third amplifier Ap3 being provided therein. With this, it becomes easier to adjust the amount of the noise component Sn1 to be canceled.

Also, the signal Sin is input to the second amplifier Ap2 and the third amplifier Ap3 that constitute the cancellation amplifier, without any attenuator to adjust the signal intensity of the signal Sin being provided in the stage before the cancellation amplifier. Accordingly, when the signal S20 is added to the signal S10, the signal Sin amplified by the second amplifier Ap2 and the third amplifier Ap3 is also added to the signal S10. Thus, the S/N ratio of the signal Sout appearing at the output node N2 is not degraded, even though the signal amplified by the second amplifier Ap2 and the third amplifier Ap3 is added to the output of the first amplifier Ap1.

(B) Second Embodiment

Figure 2:
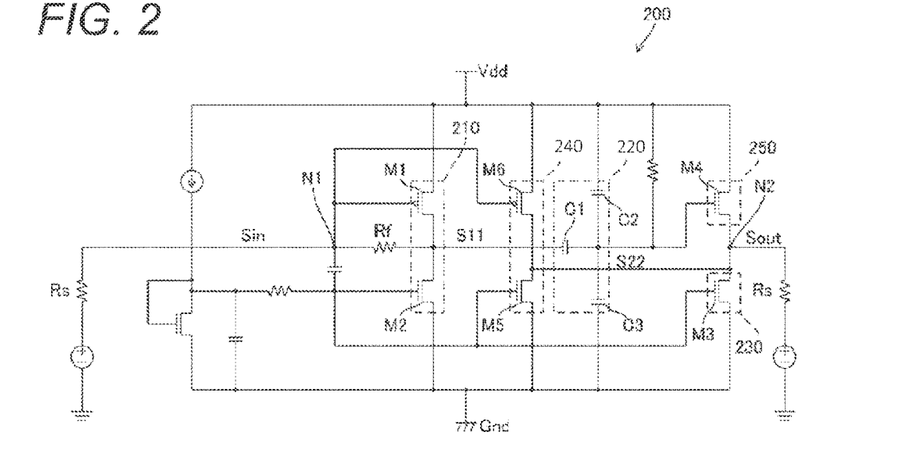
FIG. 2 is a diagram for explaining the configuration of a circuit according to a second embodiment.

FIG. 2 is a diagram for explaining the configuration of an amplifier 200 according to this embodiment. The amplifier 200 shown in the drawing includes a first amplifier 210, an attenuator 220, a second amplifier 230, a third amplifier 240, and an adder 250.

The first amplifier 210 has the configuration of a CMOS inverter that serves as a first transistor unit in which a power supply terminal of a voltage Vdd and a power supply terminal of a ground Gnd are connected by a p-channel MOS transistor (hereinafter referred to as pMOS) M1 and an n-channel MOS transistor (hereinafter referred to as nMOS) M2. The first amplifier 210 outputs a signal S11 generated by inverting and amplifying an input signal Sin of an input node N1. That is, the gate of the pMOS M1 forming the first amplifier 210 is connected to the input node N1, the drain of the pMOS M1 is connected to the power supply terminal of the voltage Vdd, and the source of the pMOS M1 is connected, via the attenuator 220, to the gate an nMOS M4 forming the adder 250. The gate of the nMOS M2 forming the first amplifier 210 is connected to the input node N1, the drain of the nMOS M2 is connected to the power supply terminal of the ground Gnd, and the source of the nMOS M2 is connected, via the attenuator 220, to the gate the nMOS M4 forming the adder 250.

The input side and the output side of the first amplifier 210 are connected by a feedback resistor Rf. Because of this, a noise component Sn1 (not shown) that is generated inside the first amplifier 210 and is output from the first amplifier 210 is fed back to the input side of the first amplifier 210. As a result of this, feedback noise Nf generated by inverting the noise component Sn1 (not shown) generated inside the first amplifier 210 is superimposed on the signal Sin of the input node N1.

The output of the first amplifier 210 is input to the adder 250 via the attenuator 220. In this embodiment, the attenuator 220 is formed as a capacitance attenuator having capacitances C1 through C3, and outputs a signal S10 generated by attenuating the signal S11 output from the first amplifier 210 at a predetermined attenuation factor At1, to the adder 250.

The adder 250 is formed with the nMOS M4 serving as a first MOS transistor element that has the drain connected to the power supply terminal of the voltage Vdd, and has the source connected to an output node N2. The adder 250 also has a configuration of a voltage follower circuit that has the gate connected to the power supply terminal of the voltage Vdd via a resistor. That is, the same voltage as the voltage input to the gate is generated at the source. Here, a signal S12 generated by the attenuator 220 attenuating the signal S11 output from the first amplifier 210 is input to the gate of the nMOS M4. Therefore, the input signal from the first amplifier 210 is output as it is to the source of the nMOS M4 via the attenuator 220. That is, a signal on which the noise component Sn1 generated in the first amplifier 210 is superimposed as it is without being inverted is output to the source of the nMOS M4.

The second amplifier 230 is interposed between the output node N2 and the power supply terminal of the ground Gnd, and is formed with an nMOS M3 serving as a second MOS transistor element having a gate to which the input signal Sin of the input node N1 is input. The input signal Sin that is input to the gate of the nMOS M3 is transferred to the nMOS M4 via the nMOS M3 while being amplified at a predetermined gain. The feedback noise Nf generated by inverting the noise component Sn1 is superimposed on the signal Sin to be input to the gate of the nMOS M3. That is, the feedback noise Nf with a phase that is the inversion of the phase of the noise component Sn1 of the signal S10 is superimposed on the signal to be output from the second amplifier 230.

The third amplifier 240 has the configuration of a CMOS inverter that serves as a second transistor unit in which the power supply terminal of the voltage Vdd and the power supply terminal of the ground Gnd are connected by a pMOS M6 and an nMOS M5. The third amplifier 240 outputs a signal S22 generated by inverting and amplifying the input signal Sin of an input node N1. That is, the gate of the pMOS M6 forming the third amplifier 240 is connected to the input node N1, the drain of the pMOS M6 is connected to the power supply terminal of the voltage Vdd, and the source of the pMOS M6 is connected to the source of the adder 250. The gate of the nMOS M5 forming the third amplifier 240 is connected to the input node N1, the drain of the nMOS M5 is connected to the power supply terminal of the ground Gnd, and the source of the nMOS M5 is connected to the source of the adder 250. The input signal Sin that is input to the third amplifier 240 is transferred to the nMOS M4 via the pMOS M6 and the nMOS M5 while being amplified at a predetermined gain. The feedback noise Nf generated by inverting the noise component Sn1 is superimposed on the signal Sin to be input to the gates of the pMOS M6 and the nMOS M5. That is, the feedback noise Nf with a phase that is the inversion of the phase of the noise component Sn1 of the signal S10 is superimposed on the signal to be output from the third amplifier 240.

The amplifier 200 having the above configuration includes the second amplifier 230 and the third amplifier 240 serving as a cancellation amplifier that cancels the noise component Sn1 generated inside the first amplifier 210. With this, it becomes easier to adjust the amount to be canceled of the noise component Sn1 generated inside the first amplifier 210.

Also, the signal Sin is input to the second amplifier 230 and the third amplifier 240 that constitute the cancellation amplifier, without intervention of any attenuator. That is, when the signal S20 is added to the signal S10, the signal Sin inverted and amplified by the second amplifier Ap2 and the third amplifier Ap3 is also added to the signal S10. Thus, the S/N ratio of the signal Sout appearing at the output node N2 is not degraded, even though the signal amplified by the second amplifier 230 and the third amplifier 240 is added to the output of the first amplifier 210.

Figure 3:
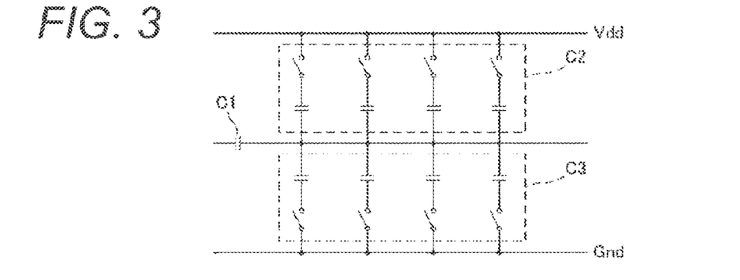
FIG. 3 is a diagram showing an example of an attenuator with an externally adjustable amount of attenuation.

Further, the amount of attenuation by the attenuator 220 may be adjusted from outside. Specifically, as shown in FIG. 3, the capacitance C2 and the capacitance C3 each have a capacitance bank configuration formed with multiple capacitances connected in parallel, for example, so that the number of the capacitances to be used can be controlled by resistor control from outside. With this, the amount of attenuation by the attenuator 220 can be adjusted. For example, control is performed to adjust a capacitance value in accordance with a result of calculation on the basis of a corner coefficient obtained from an input/output relationship of a circuit that detects MOS variation. Thus, variation in each lot can be absorbed.

It should be noted that, although the attenuator 220 is formed with a capacitance attenuator in this embodiment, the attenuator 220 may be formed with a resistance attenuator, or may be an attenuator formed with a capacitance-resistance combination. In the case of a resistance attenuator, the capacitances C2 and C3 shown in the example in FIG. 2 can be eliminated, and a resistor can be disposed in series to the right of the capacitance C1 in the attenuator, for example. With this, the number of elements constituting the attenuator 220 can be reduced, and the circuit area of the attenuator 220 can also be reduced.

Meanwhile, the second amplifier 230 and the third amplifier 240 arranged in parallel with each other may be integrated to increase the amplification factor of the second amplifier 230. In this case, however, various kinds of trouble will occur. That is, while the attenuator 220 shown in FIG. 2 is formed with the capacitances C1 through C3, the nMOS M4 forming the adder 250 also serves as an attenuator.

Here, if Gm of the nMOS M4 is ideally infinite, any problem will not occur. However, the voltage that is input to the gate of the nMOS M4 as a voltage follower circuit attenuates and appears at the source in relationship to an output resistor Rs. That is, since the gain of the first amplifier 210 is determined to be 1/Gm of the nMOS M4, the value obtained by dividing the gate voltage of the nMOS M4 with the gate-source resistor and the output resistor Rs is generated at the source of the nMOS M4.

Therefore, if the amplification factor of the second amplifier 230 is changed through a change in the current to be applied to the second amplifier 230 formed with the nMOS M3, the amplification factor for the signal S10 relative to the signal Sin changes, the signal S10 being generated at the nMOS M4 of the adder 250 also serving as an attenuator and being transmitted via the first signal path P1. If the amplification factor of the second amplifier 230 is changed through a change in the current to be applied to the second amplifier 230 as described above, the total amount of attenuation changes. As a result, the level of the feedback noise Nf to be transferred through the second signal path P2, and the level of the noise component Sn1 to be transferred through the first signal path P1 cannot be adjusted independently of each other and be matched to each other, which is a problem.

Meanwhile, the current to be applied to the second amplifier 230 formed with the nMOS M3 may be additionally applied only to the nMOS M3 via a path that does not pass through the nMOS M4. In this case, however, further noise from the current source circuit that generates the current to be additionally applied only to the nMOS M3 is superimposed on the signal being transferred through the second signal path P2. Also, if an effect such as an increase in the voltage amplitude of the signal Sout to be output can be achieved when the further noise from the current source is added, the S/N ratio will not change, and thus, any problem will not occur. However, only the noise from the current source is superimposed on the signal, and therefore, the S/N ratio is also degraded, which is a problem.

In contrast, in the configuration according to this embodiment, on the other hand, the third amplifier 240 is provided independently of the second amplifier 230, and the signal S22 generated independently by the third amplifier 240 amplifying the signal Sin is input, in parallel with the signal S21 output from the second amplifier 230, to the adder 250. In this manner, the amplification factor for the feedback noise Nf to be input to the adder 250 via the second signal path P2 as the cancellation path is made higher. In such a configuration, it is possible to generate the signal Sout that is to be input to the adder 250 via the first signal path P1 and appropriately cancels the noise component Sn1, without causing any of the above described problems.

(C) Third Embodiment

Figure 4:
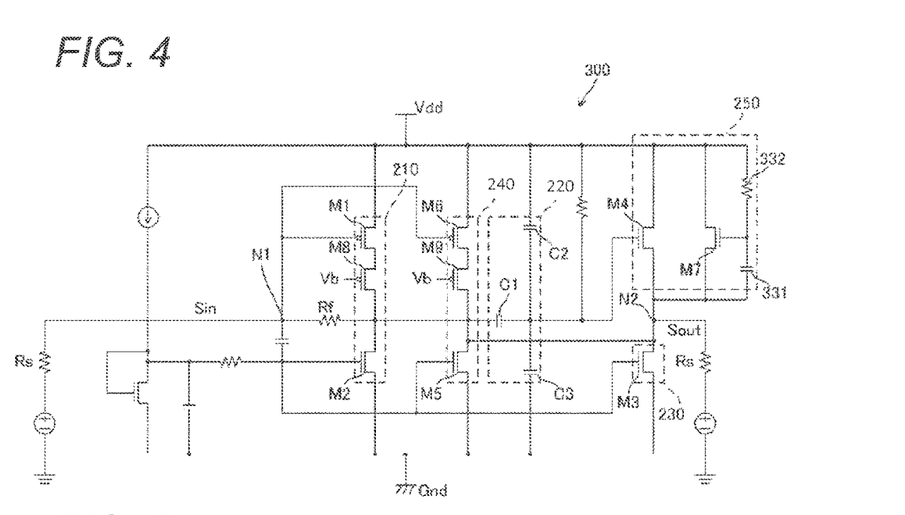
FIG. 4 is a diagram for explaining the configuration of a circuit according to a third embodiment.

Next, an amplifier 300 with a wider bandwidth and a lower voltage than those of the above described amplifier 200 according to the second embodiment is described. FIG. 4 is a diagram for explaining the configuration of the amplifier 300 according to this embodiment. It should be noted that, in this embodiment, the same components as those of the above described amplifier 200 according to the second embodiment are denoted by the same reference numerals as those used in the second embodiment, and detailed explanation of them will not be made below.

The amplifier 300 differs from the above described circuit configuration according to the second embodiment in that the MOS transistors forming the first amplifier 210 and the second amplifier 230 are cascoded. It should be noted that this embodiment will be described below through an example case where the pMOSs with the larger size between the nMOSs and the pMOSs of the respective CMOSs forming the first amplifier 210 and the second amplifier 230 are cascoded.

Here, it is known that a wider bandwidth can be achieved by cascoding MOS transistors. However, if the gate voltage of the MOS transistors (pMOSs M8 and M9 shown in FIG. 4) added through the cascoding is set at a fixed value, the transconductance of the cascode circuit dramatically drops in corner conditions (power supply voltage, temperature, and process), resulting in gain degradation and noise degradation.

In view of this, this embodiment provides a bias voltage generation unit 305 (see FIG. 5) that generates a bias voltage Vb to be applied to the gates of the pMOSs M8 and M9. The bias voltage generation unit 305 changes the bias voltage Vb to be generated, in accordance with the values of the power supply terminal of the voltage Vdd and the power supply terminal of the ground Gnd. With this, the bias voltage Vb appropriately biased in accordance with power supply voltage variation is applied to the gates of the pMOSs M8 and M9.

Here, the optimum point of the bias voltage Vb to be applied to the pMOS M8 is expressed by the mathematical formula (1) shown below. It should be noted that, in the mathematical formula (1) shown below, Vgs(M1) represents the gate-source voltage of the pMOS M1, Vds(M8) represents the drain-source voltage of the pMOS M8, and Vgs (M2) represents the gate-source voltage of the nMOS M2.

[Mathematical Formula 1]

$$Vb=Vdd-Vgs(M1)+Vds(M8)-Vgs(M2) \qquad (1)$$

With such a bias relationship, the resistance to variation in the threshold voltage Vth of each MOS transistor due to power supply voltage variation or process variation becomes higher. That is, although the power supply voltage varies in an actual circuit, a bias voltage Vb set at a fixed value (the ground Gnd or the like) does not change with variation in the power supply voltage, and the drain-source voltage of the pMOSs M1 and M6 in FIG. 4 might become lower and disappear when the power supply voltage drops. To counter this, a bias voltage Vb that varies with power supply voltage variation is generated and used, so that the drain-source voltage of the pMOSs M1 and M6 is prevented from becoming lower, and optimum biasing is performed in each corner condition.

This measure using cascoding is effective in a case where the nMOS M5 and the pMOS M6 forming the third amplifier 240 are made larger in size, to increase gain and reduce noise.

Specifically, the parasitic capacitance generated between the gate and the drain due to a gate insulating film of a MOS transistor forming an amplifier serves as a time constant for a circuit having the actual parasitic capacitance multiplied by the voltage amplification factor because of a mirror effect. Therefore, as the size of a MOS transistor is made larger, the parasitic capacitance multiplied by the voltage amplification factor causes a cutoff in the high-frequency region. That is, low-pass frequency characteristics are achieved.

Here, as the pMOSs M1 and M6 are cascoded as described above to put restraints on frequency characteristics, the amplification factor of the cascoded pMOSs can be restricted to 1, and the frequency characteristics can be limited only to the frequency characteristics of the nMOS M3 of the second amplifier 230 that is not cascoded. It should be noted that, although only the pMOSs M1 and M6 of the first amplifier 210 and the second amplifier 230 are cascoded in the example described in this embodiment, a MOS transistor of another amplifier may also be cascoded to put restraints on frequency characteristics.

Figure 5:
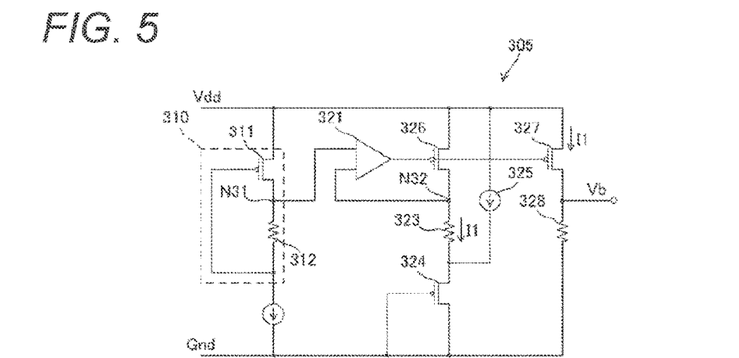
FIG. 5 is a diagram showing an example of a bias voltage generation unit.

FIG. 5 is a diagram showing an example of the bias voltage generation unit 305. This bias voltage generation unit 305 is designed to generate a bias voltage Vb having the optimum point expressed by the mathematical formula (1) shown above.

The bias voltage generation unit 305 includes a replica unit 310 of a cascode-connected MOS transistor. While the pMOSs M1 and M8 and the feedback resistor Rf form a diode circuit in the cascode connection in the first amplifier 210, for example, this replica unit 310 has a diode circuit that includes a pMOS 311 and a resistor 312, which are substantially the same as the pMOS M1 and the feedback resistor Rf. In the diode circuit of the replica unit 310, the resistor 312 is provided as the component corresponding to the pMOS M8 cascode-connected to the pMOS M1 of the first amplifier 210. The resistor 312 generates a voltage equivalent to the drain-source voltage of the pMOS M8.

Here, the voltage at a node N31 between the pMOS 311 and the resistor 312 of the replica unit 310 is expressed by the mathematical formula (2) shown below. In the mathematical formula (2) shown below, Vgs(311) represents the gate-source voltage of the pMOS 311, and Vds(312) represents the interterminal voltage of the resistor 312.

[Mathematical Formula 2]

$$Vdd-Vgs(311)+Vds(312) \quad (2)$$

An operational amplifier 321 is then used, to generate the same voltage as that at the node N31 expressed by the mathematical formula (2) shown above, at a node N32 on the upper end side of a resistor 323. On the low potential side of this resistor 323, a pMOS 324 that is substantially the same as the pMOS M2 of the first amplifier 210 is disposed, and generates a potential difference Vgs(324) between the gate and the source from a current supplied from a current source 325.

In view of the above, the current I1 flowing in the resistor 323 is expressed by the mathematical formula (3) shown below. Here, R1 represents the resistance value of the resistor 323.

[Mathematical Formula 3]

$$I1 = \frac{Vdd - Vgs(311) + Vds(312) - Vgs(324)}{R1} \quad (3)$$

Further, the current flowing in this resistor 323 is mirrored with pMOSs 326 and 327 in a circuit having a resistor 328 disposed between the power supply terminal of the voltage Vdd and the power supply terminal of the ground Gnd. That is, the current I1 flows in the resistor 328 disposed in the last stage in the bias voltage generation unit 305. Then, the voltage generated at a node N33 on the upper end side of the resistor 328 is used as the above described bias voltage Vb. Here, as the resistor 323 and the resistor 328 are made to have the same resistance value, the voltage generated at the node N33 is expressed by the mathematical formula (4) shown below.

[Mathematical Formula 4]

$$Vb=Vdd-Vgs(311)+Vds(312)-Vgs(324) \quad (4)$$

As the bias voltage generation unit 305 has the above configuration, it is possible to form a specific circuit that generates a bias voltage Vb with the above described optimum point.

Also, in this embodiment, the MOS transistor forming the adder 250 is divided into an nMOS M4 and an nMOS M7 as multiple MOS transistors that are connected in parallel. Therefore, the aspect ratio of the MOS transistors become higher, and the voltage V0 of an output node Nout becomes higher. This ensures operation in a saturated region even in a situation where the MOS transistor operates in an unsaturated region due to a voltage drop at the power supply terminal of the voltage Vdd or process variation or the like in a configuration in which the MOS transistor of the adder 250 is not divided into multiple MOS transistors.

Further, as for the nMOS M7, which is one of the divisional MOS transistors, the gate and the source are connected by a capacitance 331, and the gate and the drain are connected by a resistor 332. The resistance value of the resistor 332 is set at a sufficiently high resistance value relative to 1/gm, which is the resistance value of the nMOS M4 appearing as the load on the nMOS M3. This can make the impedance of the nMOS M7 appear inductive, and prevent the nMOS M7 from having influence as the load on the nMOS M3 in the high-frequency region.

That is, the voltage V0 at the output node Nout is expressed by the mathematical formula (5) shown below. It should be noted that, in the mathematical formula (5) shown below, Vgs(M4, M7) represents the gate-source voltage of the nMOSs M4 and M7, Id represents the current that flows in the nMOS M4 and the nMOS M7, µp represents the carrier mobility of the nMOSs M4 and M7, and Cox represents the oxide film capacitance of the nMOSs M4 and M7.

[Mathematical Formula 5]

$$V0 = Vdd - Vgs(M4, M7) \quad (5)$$
$$= Vdd - \sqrt{\frac{2 \times Id}{\mu pCox \frac{W4 \times W7}{L}}}$$

Here, the impedance Z(M4, M7) of the nMOSs M4 and M7 as the load on the nMOS M3 is expressed by the mathematical formula (6) shown below in the low-frequency region, and is expressed by the mathematical formula (7) shown below in the high-frequency region. It should be noted that, in the mathematical formula (6) and the mathematical formula (7) shown below, Gm4 and Gm7 represent the transconductance of the nMOSs M4 and M7, respectively, W4 and W7 represent the gate widths of the nMOSs M4 and M7, respectively, and L represents the gate length of the nMOSs M4 and M7, and Rx represents the resistance value of the resistor 332.

[Mathematical Formula 6]

$$Z(M4, M7) = \frac{1}{Gm4 + Gm7} \quad (6)$$
$$= \frac{1}{\sqrt{2\mu pCox\frac{1}{L}(W4+W7)Id}}$$

-continued

[Mathematical Formula 7]

$$Z(M4, M7) = \cfrac{1}{Gm4 + \cfrac{1}{Rx}} \quad (7)$$

$$= \cfrac{1}{\sqrt{2\mu pCox\cfrac{1}{L}(W4)Id} + \cfrac{1}{Rx}}$$

$$\approx \cfrac{1}{\sqrt{2\mu pCox\cfrac{1}{L}(W4)Id}} \quad \text{(in the case of } Rx \gg 1\text{)}$$

As described above, for the impedance of the nMOSs M4 and M7 as the load on the nMOS M3, the influence of the nMOS M7 in the high-frequency region is made ignorable. Thus, the operating point of the nMOS M3 under the corner conditions (low voltage, process variation, and the like) can be improved while the canceling conditions are satisfied.

It should be noted that the present technology is not limited to the above embodiments, but includes a configuration in which the respective components disclosed in the above embodiments are replaced with one another or are combined in a different manner, and a configuration in which the respective components disclosed in the known art and the above embodiments are replaced with one another or are combined in a different manner. Further, the technical scope of the present technology is not limited to the above embodiments, but covers the matter disclosed in the claims and equivalents thereof.

Additionally, the present technology may be embodied in the configurations described below.

(1)

An amplifier including: a first amplifier that is connected to an input node and generates a first intermediate signal; a feedback resistor that enables feedback of the first intermediate signal to the input node; an attenuator that receives the first intermediate signal and generates a second intermediate signal; a second amplifier that is connected to the input node and generates a third intermediate signal; a third amplifier that is connected to the input node and generates a fourth intermediate signal; and an adder that generates an output signal, using the second intermediate signal, the third intermediate signal, and the fourth intermediate signal.

(2)

The amplifier of (1), wherein the attenuator has an externally adjustable attenuation factor.

(3)

The amplifier of (1) or (2), wherein the attenuator is a capacitance attenuator.

(4)

The amplifier of (1) or (2), wherein the attenuator is a resistance attenuator.

(5)

The amplifier of (1) or (2), wherein the attenuator is an attenuator formed with a combination of a capacitance and a resistor.

(6)

The amplifier of any one of (1) to (5), wherein: the adder is formed with a MOS transistor element of a voltage follower, the second intermediate signal being input to the gate of the MOS transistor element; and the second amplifier is formed with a MOS transistor, the source and the drain of the MOS transistor being interposed between the MOS transistor of the adder and a power supply terminal, the gate of the MOS transistor of the second amplifier being connected to the input node.

(7)

The amplifier of (6), wherein:

the first amplifier is formed with a transistor element, the gate of the transistor element being connected to the input node, the drain of the transistor element being connected to a power supply terminal, the source of the transistor element being connected to the gate of the adder via the attenuator; and the third amplifier is formed with a transistor element, the gate of the transistor element being connected to the input node, the drain of the transistor element being connected to a power supply terminal, the source of the transistor element being connected to the source of the adder.

(8)

The amplifier of (6) or (7), wherein another MOS transistor is connected to the MOS transistor of the voltage follower forming the adder, the gate and the source being connected by a capacitance, the gate and the drain being connected by a resistor.

(9)

The amplifier of any one of (1) to (8), wherein: at least one of the amplifying MOS transistors forming the first amplifier, the second amplifier, and the third amplifier is formed with cascode-connected MMOS transistors, the gate of one of the cascode-connected MOS transistors being connected to the input node, a bias voltage being input from a bias voltage generation unit to the gate of another MOS transistor; and the bias voltage generation unit outputs the bias voltage fluctuated in accordance with fluctuation of a power supply voltage.

(10)

The amplifier of any one of (1) to (9), wherein the second amplifier has an inverter configuration.

(11)

An amplifier including:

a first transistor unit formed with a MOS transistor element, the gate of the MOS transistor element being connected to an input node, the drain of the MOS transistor element being connected to a power supply terminal;

a feedback resistor that enables feedback of a source output of the first transistor unit to the input node;

a second transistor unit formed with a MOS transistor element, the gate of the MOS transistor element being connected to the input node, the drain of the MOS transistor element being connected to a power supply terminal;

a first MOS transistor element of a voltage follower, the source of the first MOS transistor element being connected to an output node, the source output of the first transistor unit and a source output of the second transistor unit being input to the gate of the first MOS transistor element; and a second MOS transistor element, the source and the drain of the second MOS transistor element being interposed between the source of the first MOS transistor element and a power supply terminal, the gate of the second MOS transistor element being connected to the input node.

REFERENCE SIGNS LIST

10 First amplification unit
20 Second amplification unit
30 Adder
100 Amplifier
200 Amplifier
210 First amplifier 210 First amplifier
220 Attenuator
230 Second amplifier
240 Third amplifier
250 Adder
300 Amplifier
305 Bias voltage generation unit
At Attenuator
Ap1 First amplifier
Ap2 Second amplifier
Ap3 Third amplifier
M1 pMOS
M2 nMOS
M3 nMOS
M4 nMOS
M5 nMOS
M8 pMOS
M9 pMOS
N1 Input node
N2 Output node
P1 First signal path
P2 Second signal path

The invention claimed is:

1. An amplifier circuit, comprising:
a first amplifier configured to generate a first intermediate signal, wherein the first amplifier is connected to an input node;
a feedback resistor configured to feed back the first intermediate signal to the input node;
an attenuator configured to receive the first intermediate signal and generate a second intermediate signal;
a second amplifier configured to generate a third intermediate signal, wherein the second amplifier is connected to the input node, and
wherein the second amplifier has an inverter configuration;
a third amplifier configured to generate a fourth intermediate signal, wherein the third amplifier is connected to the input node; and
an adder configured to generate an output signal based on the second intermediate signal, the third intermediate signal, and the fourth intermediate signal.

2. The amplifier circuit according to claim 1, wherein the attenuator has an externally adjustable attenuation factor.

3. The amplifier circuit according to claim 1, wherein the attenuator is a capacitance attenuator.

4. The amplifier circuit according to claim 1, wherein the attenuator is a resistance attenuator.

5. The amplifier circuit according to claim 1, wherein the attenuator comprises a combination of a capacitance and a resistor.

6. The amplifier circuit according to claim 1, wherein:
the adder comprises a MOS transistor element of a voltage follower,
a gate of the MOS transistor element is configured to receive the second intermediate signal,
the second amplifier comprises a first MOS transistor,
a source of the first MOS transistor and a drain of the first MOS transistor are between a second MOS transistor of the adder and a power supply terminal, and
a gate of the first MOS transistor of the second amplifier is connected to the input node.

7. The amplifier circuit according to claim 6, wherein:
the first amplifier comprises a first transistor element, a gate of the first transistor element is connected to the input node, a drain of the first transistor element is connected to the power supply terminal, a source of the first transistor element is connected to the gate of the adder via the attenuator,
the third amplifier comprises a second transistor element, a gate of the second transistor element is connected to the input node, a drain of the second transistor element is connected to the power supply terminal, and a source of the second transistor element is connected to a source of the adder.

8. The amplifier circuit according to claim 6, further comprising a third MOS transistor connected to the MOS transistor element of the voltage follower, wherein the third MOS transistor constitutes the adder, wherein a gate of the third MOS transistor and a source of the third MOS transistor are connected by a capacitance, and wherein the gate of the third MOS transistor and a drain of the third MOS transistor are connected by a resistor.

9. The amplifier circuit according to claim 1, wherein:
an amplifying MOS transistor of at least one of the first amplifier, the second amplifier, or the third amplifier comprises a plurality of cascode-connected MOS transistors,
a gate of one of the plurality of cascode-connected MOS transistors is connected to the input node,
a bias voltage generation unit outputs a bias voltage to a gate of a MOS transistor, wherein the MOS transistor is different from the plurality of cascode-connected MOS transistors; and
the bias voltage generation unit outputs the bias voltage that fluctuates based on a fluctuation of a power supply voltage.

10. An amplifier circuit, comprising:
a first transistor unit that comprises a first MOS transistor, wherein a gate of the first MOS transistor is connected to an input node, and wherein a drain of the first MOS transistor is connected to a power supply terminal;
a feedback resistor configured to feed back an output of the first transistor unit to the input node;
a second transistor unit that comprises a second MOS transistor, wherein a gate of the second MOS transistor is connected to the input node, and wherein a drain of the second MOS transistor is connected to the power supply terminal;
a first MOS transistor element of a voltage follower, wherein a source of the first MOS transistor element is connected to an output node, and wherein a source output of the first transistor unit and a source output of the second transistor unit are input to a gate of the first MOS transistor element; and
a second MOS transistor element, wherein a source of the second MOS transistor element and a drain of the second MOS transistor element are between the source of the first MOS transistor element and the power supply terminal, and wherein a gate of the second MOS transistor element is connected to the input node.

11. An amplifier circuit, comprising:
a first amplifier configured to generate a first intermediate signal, wherein the first amplifier is connected to an input node;
a feedback resistor configured to feed back the first intermediate signal to the input node;
a capacitance attenuator configured to receive the first intermediate signal and generate a second intermediate signal;
a second amplifier configured to generate a third intermediate signal, wherein the second amplifier is connected to the input node;

a third amplifier configured to generate a fourth intermediate signal, wherein the third amplifier is connected to the input node; and an adder configured to generate an output signal based on the second intermediate signal, the third intermediate signal, and the fourth intermediate signal.

12. An amplifier circuit, comprising:

a first amplifier configured to generate a first intermediate signal, wherein the first amplifier is connected to an input node;

a feedback resistor configured to feed back the first intermediate signal to the input node;

an attenuator configured to receive the first intermediate signal and generate a second intermediate signal;

a second amplifier configured to generate a third intermediate signal, wherein the second amplifier is connected to the input node;

a third amplifier configured to generate a fourth intermediate signal, wherein the third amplifier is connected to the input node; and an adder configured to generate an output signal based on the second intermediate signal, the third intermediate signal, and the fourth intermediate signal, wherein:
- the adder comprises a MOS transistor element of a voltage follower, wherein the second intermediate signal is input to a gate of the MOS transistor element,
- the second amplifier comprises a first MOS transistor,
- a source of the first MOS transistor and a drain of the first MOS transistor are between a second MOS transistor of the adder and a power supply terminal, and
- a gate of the first MOS transistor of the second amplifier is connected to the input node.

13. An amplifier circuit, comprising:

a first amplifier configured to generate a first intermediate signal, wherein the first amplifier is connected to an input node;

a feedback resistor configured to feed back the first intermediate signal to the input node;

an attenuator configured to receive the first intermediate signal and generate a second intermediate signal;

a second amplifier configured to generate a third intermediate signal, wherein the second amplifier is connected to the input node;

a third amplifier configured to generate a fourth intermediate signal, wherein the third amplifier is connected to the input node; and an adder configured to generate an output signal based on the second intermediate signal, the third intermediate signal, and the fourth intermediate signal, wherein:
- an amplifying MOS transistor of at least one of the first amplifier, the second amplifier, or the third amplifier comprises a plurality of cascode-connected MOS transistors,
- a gate of one of the plurality of cascode-connected MOS transistors is connected to the input node,
- a bias voltage generation unit outputs a bias voltage to a gate of a MOS transistor, wherein the MOS transistor is different from the plurality of cascode-connected MOS transistors; and
- the bias voltage generation unit outputs the bias voltage that fluctuates based on a fluctuation of a power supply voltage.

* * * * *